United States Patent
Tanaka et al.

(10) Patent No.: US 7,969,172 B2
(45) Date of Patent: Jun. 28, 2011

(54) PROBING METHOD AND PROBING PROGRAM

(75) Inventors: Hideaki Tanaka, Nirasaki (JP); Yukihiko Fukasawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 159 days.

(21) Appl. No.: 12/536,761

(22) Filed: Aug. 6, 2009

(65) Prior Publication Data
US 2010/0033200 A1  Feb. 11, 2010

(30) Foreign Application Priority Data
Aug. 8, 2008  (JP) .................................. 2008-205707

(51) Int. Cl.
*G01R 31/20*  (2006.01)
(52) U.S. Cl. ................................. 324/754.08
(58) Field of Classification Search .............. 257/48; 438/14–18
See application file for complete search history.

(56) References Cited

U.S. PATENT DOCUMENTS
6,262,586 B1 * 7/2001 Furasawa ................. 324/750.24
7,313,494 B2 * 12/2007 Takahashi ....................... 702/85

FOREIGN PATENT DOCUMENTS
JP 5-299485  11/1993
JP 10-98082  4/1998

* cited by examiner

*Primary Examiner* — Ha Tran T Nguyen
*Assistant Examiner* — Tung X Nguyen
(74) *Attorney, Agent, or Firm* — Oblon, Spivak, McClelland, Maier & Neustadt, L.L.P.

(57) ABSTRACT

Disclosed is a probing method including, when the probes are configured to make contact with a chip row including four chips continuously arranged in an oblique direction so that the probe card test four chips at a time, finding a first reference oblique chip row extending in the oblique direction and containing a center chip positioned at the center of the wafer and a plurality of first additional oblique chip rows arranged in parallel with the first reference oblique chip row at an upper side of the first reference oblique chip row, and setting contact positions between the probes and the first oblique chip rows wherein the contact positions are positions of the probes obtained by shifting the probes; setting contact positions between the probes and the second oblique chip rows in an opposite direction to a first step; and setting a plurality of index group and test order.

10 Claims, 12 Drawing Sheets

PROBING METHOD AND PROBING PROGRAM

CROSS-REFERENCE TO RELATED APPLICATIONS

This document claims priority to Japanese Patent Application No. 2008-205707, filed on Aug. 8, 2008, the entire content of which are hereby incorporated by reference.

FIELD OF THE INVENTION

The present invention relates to a probing method for performing a test on electrical characteristics of chips formed in a test object; and, more particularly, to a probing method for testing a plurality of chips at a time and a program used for probing purposes.

BACKGROUND OF THE INVENTION

As shown in FIG. 12 for example, a probing apparatus serving as one of conventional test devices includes a loader chamber 61 and a prober chamber 62, both of which are arranged adjacent to each other. The loader chamber 61 includes a cassette storage unit for storing wafers W on a cassette-by-cassette basis, a wafer transfer mechanism for loading and unloading the wafers W to and from a cassette one by one, and a pre-alignment mechanism for preliminarily aligning the wafers W while they are transferred by the wafer transfer mechanism. The prober chamber 62 includes a mounting table 63 configured to hold and move a wafer W in X, Y, Z and θ directions, a probe card 64 having a plurality of probes 64A that makes contact with electrode pads of chips formed in the wafer W mounted on the mounting table 63, a fixing mechanism 65 for fixing the probe card 64 by a card holder (not shown), and a connector ring 66 for electrically connecting the probe card 64 to a test head T. Under the control of a control unit, a test on electrical characteristics of the chips is carried out by electrically connecting a tester (not shown) to the chips through the test head T, the connector ring 66 and the probe card 64. In FIG. 12, reference character 67 designates an alignment mechanism that performs position alignment of the wafer W with the probe card 64 in cooperation with the mounting table 63. Reference character 67A designates an upper camera, 67B designates a lower camera and 68 designates a head plate to which the fixing mechanism 65 for fixing the probe card 64 is attached.

In recent years, the wiring structure of a chip becomes minute and highly dense at a rapid pace, and the number of chips formed in a single wafer W has been drastically increased. In view of this, Japanese Patent Laid-open Application Nos. H10-098082 and H05-299485 disclose techniques of enhancing the test efficiency through the use of a probe card capable of testing a plurality of chips at a time.

Disclosed in H10-098082 is a probing method in which a test is performed by bringing a plurality of probes into contact with a plurality of chips on a wafer in an oblique direction. In this probing method, the test is conducted with a probe card confined inside the wafer lest the end portions of the probes should lie outside the marginal portion of the wafer, thereby preventing damage to the probes card which would otherwise occur due to some of the end portions of the probes lying outside the wafer.

Taught in H05-299485 is a probing method capable of shortening a test time by reducing the movement distance of a wafer. In this probing method, probes are prevented from making contact with the same chips more than once. The test starting position in a next row of chips is determined each time a row of chips is changed, which makes it possible to shorten the movement distance of the wafer.

In case of the probing method described in H10-098082, however, some of the probes make contact with a same chip within the wafer more than once. Therefore, there is a need to impose restrictions on the signal transmission and reception not to test the same chip more than once. Another problem resides in that the increased number of contacts between the probes and the chips results in an increase in the movement distance of the wafer. In case of the probing method described in H05-299485, the wafer having chips arranged in rows and columns is repeatedly moved in one row by a distance corresponding to the number of chips tested at a time and is reciprocated by the number of times corresponding to the number of rows of the chips. This poses a problem of increasing the movement distance of the wafer. Another problem posed in the probing method of H05-299485 is that a great deviation occurs in the frequency of use of the probes arranged in the opposite end portions of the probe card.

SUMMARY OF THE INVENTION

In view of the above, the present invention provides a probing method and program capable of reducing the movement distance of a target object such as a wafer or the like to thereby shorten the test time, and also capable of substantially equalizing, the use frequency of probes arranged in the opposite end portions of a probe card to thereby enhance the durability of the probe card.

In accordance with a first aspect of the present invention, there is provided a probing method for, under the control of a control unit, moving a mounting table with a wafer mounted thereon to bring a plurality of probes of a probe card into electrical contact with a number of chips arranged in the wafer along an oblique direction and for conducting a test of electrical characteristics of the chips, wherein a predetermined number of chips are tested at a time.

The probing method includes: a first step of finding a first reference oblique chip row extending in the oblique direction and containing a center chip positioned at the center of the wafer and a plurality of first additional oblique chip rows arranged in parallel with the first reference oblique chip row in a first region at an upper side of the first reference oblique chip row wherein the first reference oblique chip row is a lowermost chip row in the first region and the first reference oblique chip row includes an uppermost chip row of the first region, and setting contact positions between the probes and the first oblique chip rows consisting of the first reference oblique chip row and the first additional oblique chip rows, wherein the contact positions are positions of the probes obtained by shifting the probes by a distance corresponding to the predetermined number of chips at a time using a chip positioned at a lower end of each first oblique chip row as a starting point; a second step of finding a second reference oblique chip row arranged in parallel with and next to the first reference oblique chip row in a second region at a lower side of the first reference oblique chip row and a multiplicity of second additional oblique chip rows arranged in the second region in parallel with the second reference oblique chip row, wherein the second reference oblique chip row is an uppermost chip row in the second region and the second additional oblique chip rows includes a lowermost chip row of the second region and setting contact positions between the probes and the second oblique chip rows consisting of the second reference oblique chip row and the second additional oblique chip rows wherein the contact positions are positions of the probes by shifting the probes by a distance corresponding to the predetermined numbers of chips at a time using a chip positioned at an upper end of each second oblique chip row as a starting point; and a third step of, based on the setting of the contact positions made in the first and second steps, setting a first index group containing contact positions disposed at one of a left and a right end portion of the wafer and sequentially setting next index groups for the remaining contact positions, each of the first and the next index groups being elongated in up and down directions, and setting an index transfer order of the respective contact positions along a serpentine course extending in the up and down directions from the first index group toward an index group disposed at the order end portion of the wafer.

In accordance with a second aspect of the present invention, there is provided a probing program that operates a computer to perform a probing method for moving a mounting table with a wafer mounted thereon to bring a plurality of probes of a probe card into electrical contact with a number of chips arranged in the wafer along an oblique direction and for conducting a test of electrical characteristics of the chips, wherein a predetermined number of chips are tested at a time.

The probing program includes: a first step of finding a first reference oblique chip row extending in the oblique direction and containing a center chip positioned at the center of the wafer and a plurality of first additional oblique chip rows arranged in parallel with the first reference oblique chip row in a first region at an upper side of the first reference oblique chip row wherein the first oblique chip row is a lowermost chip row in the first region and the first reference oblique chip row includes an uppermost chip row of the first region, and setting contact positions between the probes and the first oblique chip rows consisting of the first reference oblique chip row and the first additional oblique chip rows, wherein the contact positions are positions of the probes obtained by shifting the probes by a distance corresponding to the predetermined number of chips at a time using a chip positioned at a lower end of each first oblique chip row as a starting point; a second step of finding a second reference oblique chip row arranged in parallel with and next to the first reference oblique chip row in a second region at a lower side of the first reference oblique chip row and a multiplicity of second additional oblique chip rows arranged in the second region in parallel with the second reference oblique chip row, wherein the second reference oblique chip row is an uppermost chip row in the second region and the second additional oblique chip rows includes a lowermost chip row of the second region and setting contact positions between the probes and the second oblique chip rows consisting of the second reference oblique chip row and the second additional oblique chip rows wherein the contact positions are positions of the probes by shifting the probes by a distance corresponding to the predetermined numbers of chips at a time using a chip positioned at an upper end of each second oblique chip row as a starting point; and a third step of, based on the setting of the contact positions made in the first and second steps, setting a first index group containing contact positions disposed at one of a left and a right end portion of the wafer and sequentially setting next index groups for the remaining contact positions, each of the first and the next index groups being elongated in up and down directions, and setting an index transfer order of the respective contact positions along a serpentine course extending in the up and down directions from the first index group toward an index group disposed at the order end portion of the wafer.

In accordance with a third aspect of the present invention, there is provided a probing method for, under the control of a control unit, moving a table with a wafer mounted thereon to bring a plurality of probes of a probe card into electrical contact with a plurality of chips arranged in the wafer along a transverse direction and for conducting a test of electrical characteristics of the chips, wherein a determined number of chips are tested at a time.

The probing method includes: a first step of finding a first reference transverse chip row extending in a transverse direction and containing a center chip positioned at the center of the wafer, and setting contact positions between the probes and the first reference chip row, wherein the contact positions are position of the probes obtained by shifting the probes by a distance corresponding to the predetermined number of chips at a time along the first reference chip row, at which time an end chip positioned at one of a left and a right end of the first reference transverse chip row is used as a starting point; a second step of finding first additional transverse chip rows arranged in parallel with the first reference transverse chip row in a first region at an upper side of the first reference chip row, and setting contact positions between the probes and each first additional transverse chip row wherein the contact positions are position of the probes obtained by shifting the probes by a distance corresponding to the predetermined number of chips at a time along each first additional transverse chip row, at which time an end chip positioned at said one end of each first additional transverse chip row is used as a starting point; a third step of finding second additional transverse chip rows arranged in parallel with the first reference transverse chip row in a second region at a lower side of the first reference chip row, and setting contact positions between the probes and each second additional transverse chip row wherein the contact positions are position of the probes obtained by shifting the probes by a distance corresponding to the predetermined number of chips at a time along each second additional transverse chip rows, at which time an end chip positioned at the other end of each second additional transverse chip row is used as a starting point; and a fourth step of, based on the setting of the contact positions made in the first through third steps, setting a first index group containing contact positions disposed at one of a left and a right end portion of the wafer and sequentially setting next index groups for the remaining contact positions toward the other end portion of the wafer, each of the first and the next index groups being elongated in up and down directions, and setting an index transfer order of the respective contact positions along a serpentine course extending in the up and down directions from the first index group toward an index group disposed at the other end portion of the wafer.

In accordance with a fourth aspect of the present invention, there is provided a probing program that operates a computer to perform a probing method for moving a table with a wafer mounted thereon to bring a plurality of probes of a probe card into electrical contact with a plurality of chips arranged in the wafer along a transverse direction and for conducting a test of electrical characteristics of the chips, wherein a determined number of chips are tested at a time.

The probing program includes: a first step of finding a first reference transverse chip row extending in a transverse direction and containing a center chip positioned at the center of the wafer, and setting contact positions between the probes and the first reference chip row, wherein the contact positions are position of the probes obtained by shifting the probes by a distance corresponding to the predetermined number of chips at a time along the first reference chip row, at which time an end chip positioned at one of a left and a right end of the first reference transverse chip row is used as a starting point; a second step of finding first additional transverse chip rows arranged in parallel with the first reference transverse chip row in a first region at an upper side of the first reference chip row, and setting contact positions between the probes and each first additional transverse chip row wherein the contact positions are position of the probes obtained by shifting the probes by a distance corresponding to the predetermined number of chips at a time along each first additional transverse chip row, at which time an end chip positioned at said one end of each first additional transverse chip row is used as a starting point; a third step of finding second additional transverse chip rows arranged in parallel with the first reference transverse chip row in a second region at a lower side of the first reference chip row, and setting contact positions between the probes and each second additional transverse chip row wherein the contact positions are position of the probes obtained by shifting the probes by a distance corresponding to the predetermined number of chips at a time along each second additional transverse chip rows, at which time an end chip positioned at the other end of each second additional transverse chip row is used as a starting point; and a fourth step of, based on the setting of the contact positions made in the first through third steps, setting a first index group containing contact positions disposed at one of a left and a right end portion of the wafer and sequentially setting next index groups for the remaining contact positions toward the other end portion of the wafer, each of the first and the next index groups being elongated in up and down directions, and setting an index transfer order of the respective contact positions along a serpentine course extending in the up and down directions from the first index group toward an index group disposed at the other end portion of the wafer.

BRIEF DESCRIPTION OF THE DRAWINGS

The objects and features of the present invention will become apparent from the following description of embodiments given in conjunction with the accompanying drawings, in which:

FIGS. 4A and 4B are views for explaining a process of setting contact positions of probes performed by employing the probing method illustrated in FIGS. 2 and 3, wherein FIG. 4A is a plan view showing the arrangement of probes of the probe card and the arrangement of chips corresponding thereto and FIG. 4B shows the wafer coordinates indicating the detected chip rows on the wafer;

FIGS. 8A and 8B are views for explaining a process of setting contact positions of probes performed by a probing method in accordance with a second embodiment of the present invention, wherein FIG. 8A is a plan view showing the arrangement of probes of the probe card and the arrangement of chips corresponding thereto and FIG. 8B shows the wafer coordinates indicating the detected chip rows on the wafer;

DETAILED DESCRIPTION OF THE EMBODIMENTS

Hereinafter, embodiments of the present invention will be described in detail with reference to the accompanying drawings which form a part hereof.

First Embodiment

Figure 1:
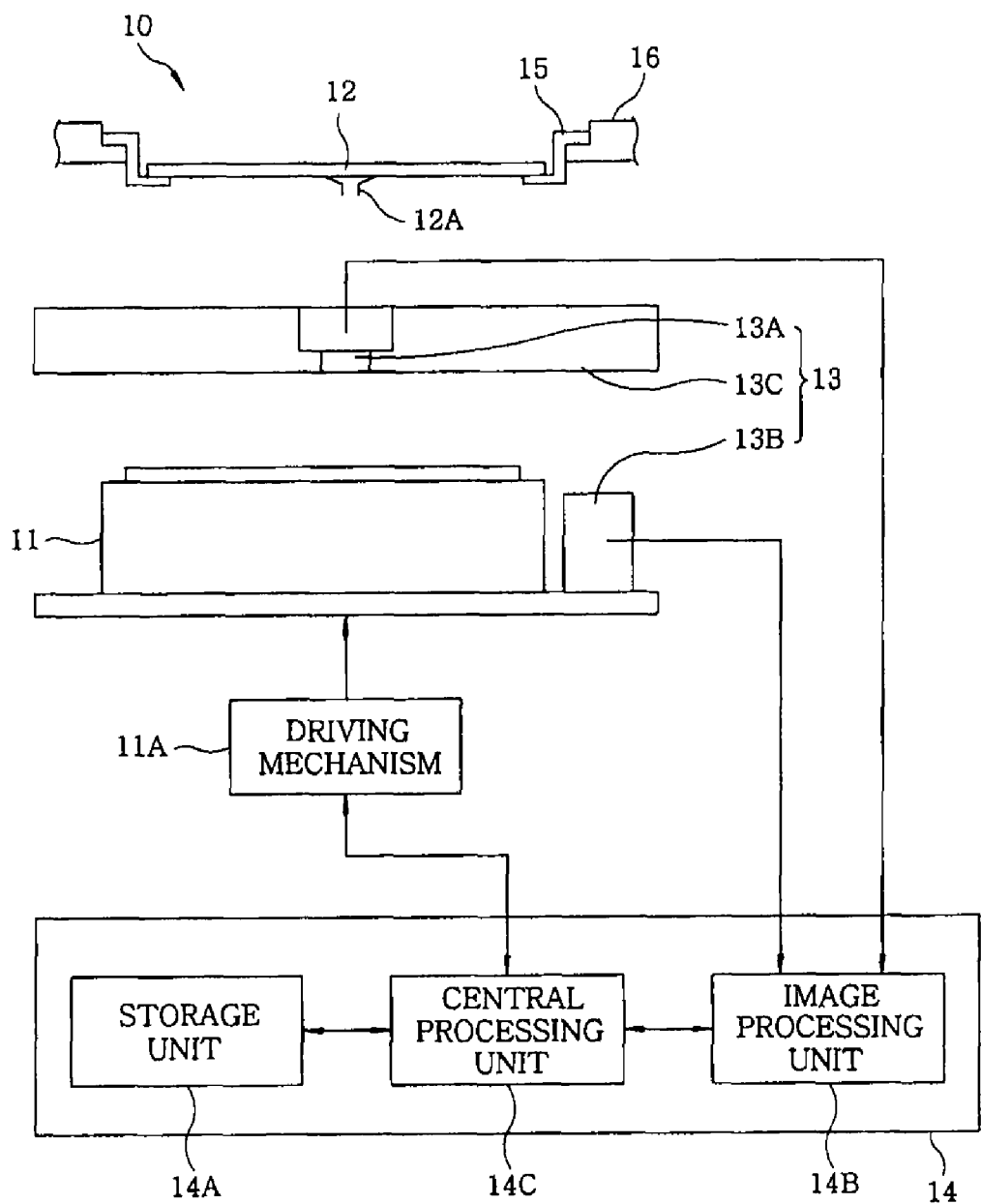
FIG. 1 is a configuration view showing a probing apparatus used in practicing a probing method in accordance with a first embodiment of the present invention.

A probing apparatus for practicing a probing method in accordance with a first embodiment will be described with reference to FIG. 1. As shown in FIG. 1 for example, the probing apparatus 10 includes a mounting table 11 arranged within a prober chamber for movement in X, Y, Z and θ directions, a probe card 12 arranged above the mounting table 11 and an alignment mechanism 13 for aligning the wafer W mounted on the mounting table 11 with the probe card 12. Under the control of a control unit 14, the mounting table 11 and the alignment mechanism 13 cooperate with each other to align a plurality of electrode pads formed on the chips of the wafer W with a plurality of probes 12A arranged in the probe card 12. Thereafter, the wafer W is index-transferred by the mounting table 11 to perform a test on electrical characteristics of the chips formed in the wafer W.

Referring to FIG. 1, the mounting table 11 includes a driving mechanism 11A containing an X-direction driving mechanism, a Y-direction driving mechanism, a Z-direction driving mechanism and θ-direction mechanism. Thus, the mounting table 11 can be moved in the X, Y, Z and θ directions by the drive mechanism 11A under the control of the control unit 14.

Figure 4A:
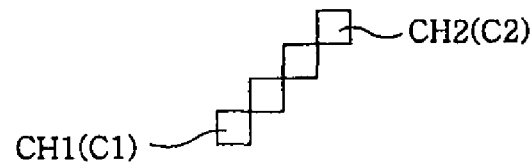

As shown in FIG. 1, the probe card 12 is provided with a plurality of probes 12A and is fixed to a head plate 16 through a card holder 15. As illustrated in FIG. 4A for example, the probes 12A are configured to make contact with a chip row including four chips C continuously arranged in an oblique direction, among a plurality of chips C formed on the wafer W in a matrix form, so that the probe card 12 can test four chips C at a time. Hereinafter, the probe card 12 for simultaneously testing a plurality of chips (four chips in the present embodiment) will be referred to as a multi-card 12. The number of chips tested at a time will be called a multi-number. If the multi-number is four, it means that the number of chips is four. In FIG. 4A, reference characters CH1 and CH2 designate the lowermost and the uppermost channel of the probe card 12, and C1 and C2 designate the lowermost and the uppermost chip of the chip row, wherein a channel represents a group of probe 12A for one chip. In this example, the multi-number represents the number of channels of the probe card 12A and the maximum number of chips that can be tested at a time.

As shown in FIG. 1, the alignment mechanism 13 includes a first camera 13A movable between the mounting table 11 and the probe card 12, a second camera 13B installed at one side of the mounting table 11 and an alignment bridge 13C to which the first camera 13A is attached. The first camera 13A is movable along the alignment bridge 13C between a peripheral side of the prober chamber and the probe center (positioned on an extension line of the center point of the probe card 12). At the probe center, the first camera 13A takes an image of the wafer W mounted on the mounting table 11 moving in the X and Y directions. The second camera 13B moves together with the mounting table 11 to a position just below the probes 12A of the probe card 12, at which position the second camera 13B takes an image of the probes 12A.

The control unit 14 includes a storage unit 14A for storing various kinds of programs including a probing program of the present invention and various kinds of data, an image processing unit 14B for processing images based on imaging signals sent from the first and the second camera 13A and 13B, and a central processing unit 14C for performing specified arithmetic processing while transmitting and receiving various kinds of data to and from the storage unit 14A and the image processing unit 14B. The control unit 14 includes a computer as its main component. The central processing unit 14C is configured to read out the probing program and the like from the storage unit 14A, to display various kinds of images including a wafer image on the screen of a display device (not shown), and to set the contact positions of the probes 12A of the probe card 12 while setting the index groups to be described later.

Next, a probing method using a probing program in accordance with the first embodiment of the present invention will be described with reference to FIGS. 2 through 6.

While the computer as a main body of the control unit 14 is operated by the probing program of the present embodiment, the central processing unit 14C reads out the probing program from the storage unit 14A to perform the probing method of the present embodiment. In the probing method of the present embodiment in accordance with the flow illustrated in FIGS. 2 and 3, contact positions of the multi-card 12 on the wafer W are first set. Then, index groups to be used in index-transferring the wafer W and an index order of the contact positions are set based on the contact positions set above. Thereafter, the wafer W and the multi-card 12 are aligned with each other, and the electrical characteristics of the wafer W are then tested according to the index order of the respective index groups.

Figure 4B:
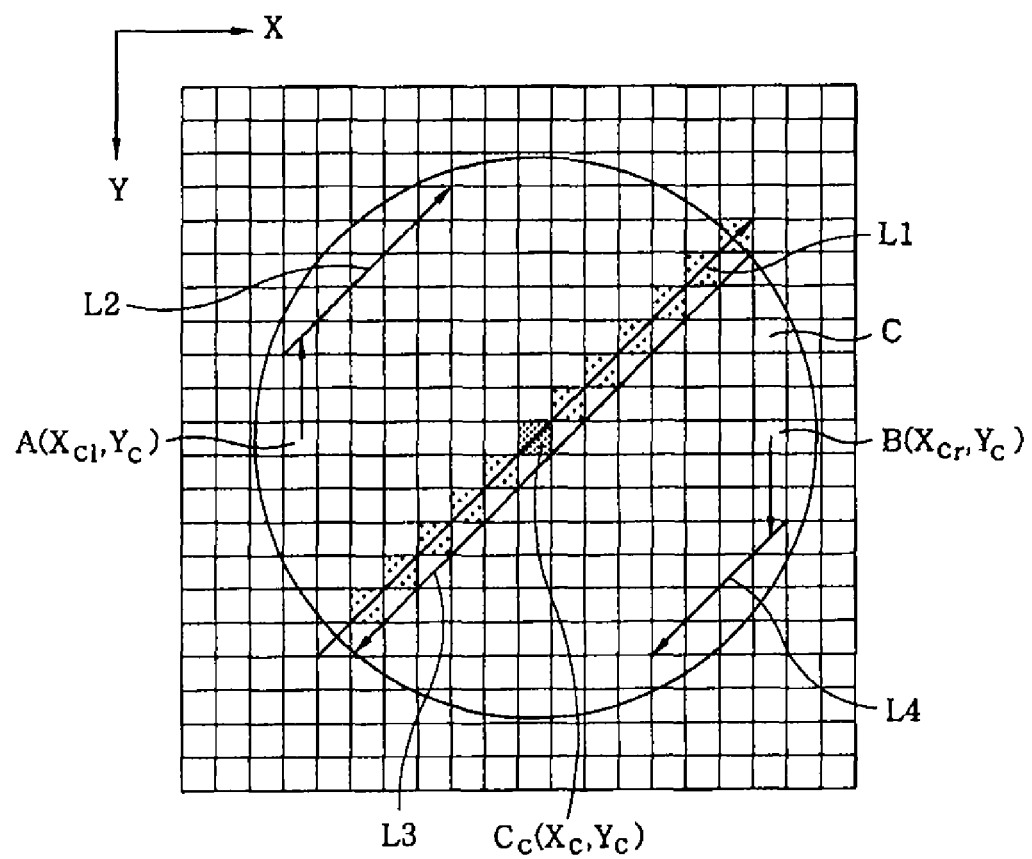

The contact positions at which the probes 12A of the multi-card 12 make contact with the wafer W are set in the following manner. As shown in FIG. 4B, determined first is a chip row arranged in an oblique or a diagonal direction (hereinafter referred to as a "first reference oblique chip row") L1 containing a center chip Cc of coordinate values $(X_c, Y_c)$ positioned at the center of the wafer W. Using the first reference oblique chip row L1 as a demarcation line, the wafer W is divided into a left upper first region containing the first reference oblique chip row L1 and a right lower second region not containing the first reference oblique chip row L1 but containing an oblique chip row L3 (hereinafter referred to as a "second reference oblique chip row") L3 positioned at the right lower side of and next to the first reference oblique chip row L1. The contact positions of the multi-card 12 are set in this state.

Figure 2:
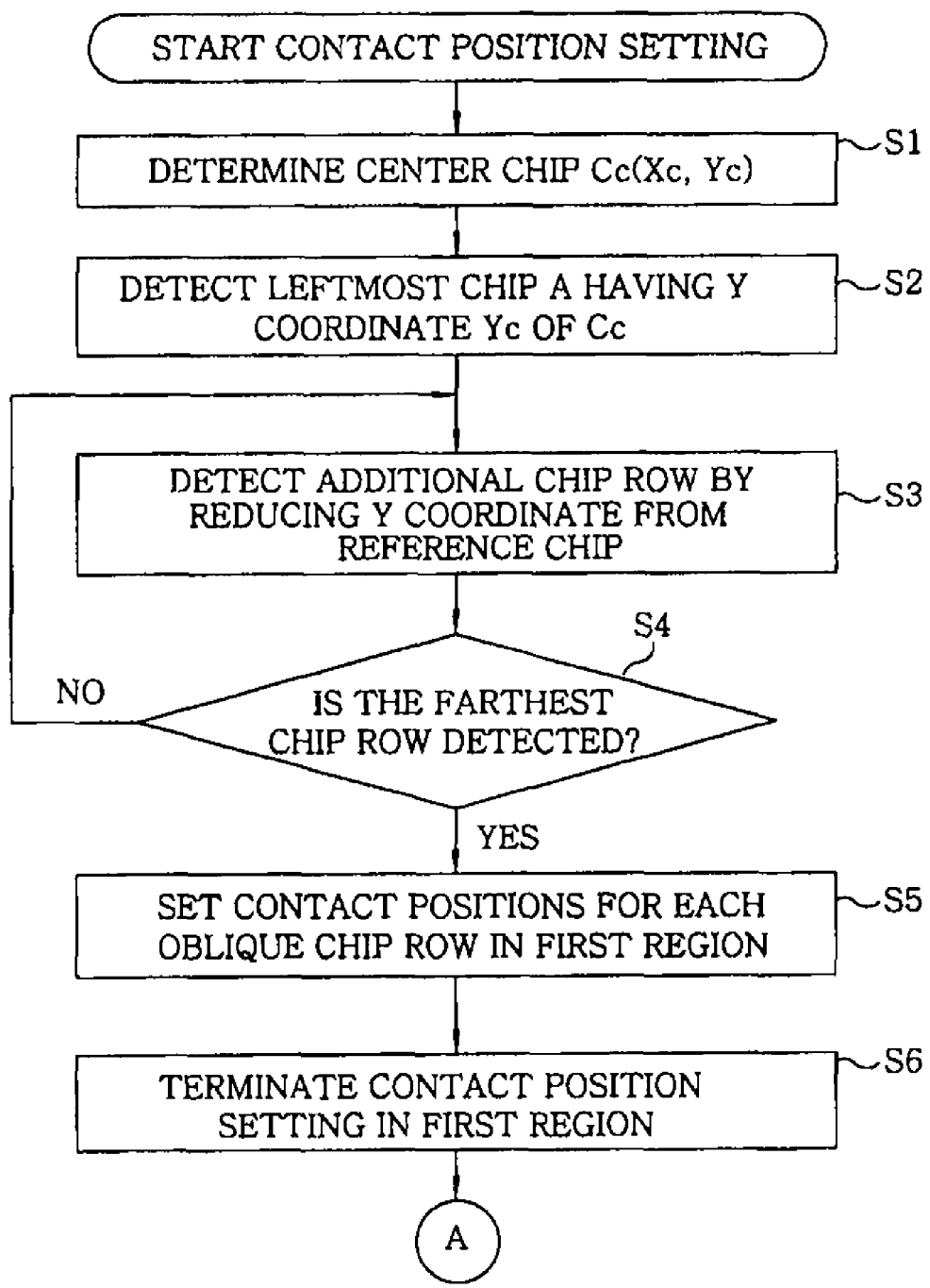
FIG. 2 is a flow chart illustrating a method of setting probe card contact positions in accordance with the first embodiment of the present invention.

Specifically, referring to the flow chart illustrated in FIG. 2, the mounting table 11 receives the wafer W from a loader chamber and moves to a position just below the first camera 13A waiting at the probe center, during which time the chip C positioned at the center of the wafer W is determined as the center chip Cc and the determination of the first reference oblique chip row L1 and the first and the second region is made as described above (step S1). Next, a leftmost end chip having a same coordinate value as that of the center chip Cc is detected as a chip A (step S2). Contact positions of the multi-card 12 in the first region of the wafer W are detected by using the chip A as a reference point. Coordinate values of the chip A are identified by $(X_{c1}, Y_c)$ and the chip A is set as a reference chip.

In order to set the contact positions in the first region, a chip C belonging to the leftmost chip column is detected first by reducing the y coordinate value by one from the reference chip and the newly detected chip C is updated as the reference chip; and then the newly set reference chip and chips C residing in the right upper direction from the reference chip are detected as an additional oblique or diagonal chip row (step S3). The additional oblique chip row is parallel to the first reference oblique chip row L1.

Then, determination is made as to whether the additional oblique chip row thus detected is the one positioned farthest from the first reference oblique chip row L1 (step S4). If not, the flow returns to step S3 and the processing noted above is repeated until an additional oblique chip row 2 farthest from the first reference oblique chip row L1 is detected. If the farthest additional oblique chip row 2 is detected in step S4, the process proceeds to step S5 where the contact positions of the multi-card 12 in the first region of the wafer W are set.

In order to set the contact positions throughout the first region of the wafer W in step S5, the lowermost channel CH1 of the probes 12A of the multi-card 12 is aligned with the lowermost chip C of the first reference oblique chip row L1. The positions thus aligned (i.e., positions of the chips aligned with the 4 channels of the multi-card 12) are set as first contact positions. In addition, sequentially determined as further contact positions on the first reference oblique chip row L1, as shown in FIG. 4B, are the positions of the channels of the multi-card 12 shifted from the first contact positions by N*(multi-number) until the uppermost chip C of the first reference oblique chip row L1 is aligned with one of the channels of the multi-card 12, wherein N is a natural number (N=1, 2, 3, . . . ) and N*(multi-number) will be referred to as multiplication number hereinafter. In this manner, the contact positions with respect to each of the oblique chip rows in the first region ranging from the first reference oblique chip row L1 to the farthest additional oblique chip row 2 set, thus terminating the setting of the contact positions throughout the first region (step S6). Since the contact positions in the first region are set by using the lowermost chip C of each oblique chip row in the first region as a reference chip, it is sometimes the case that, in the right upper end contact positions, some of the probes 12A of the multi-card 12 do not make contact with the chips C within the first region but lie outside the wafer W.

Figure 3:
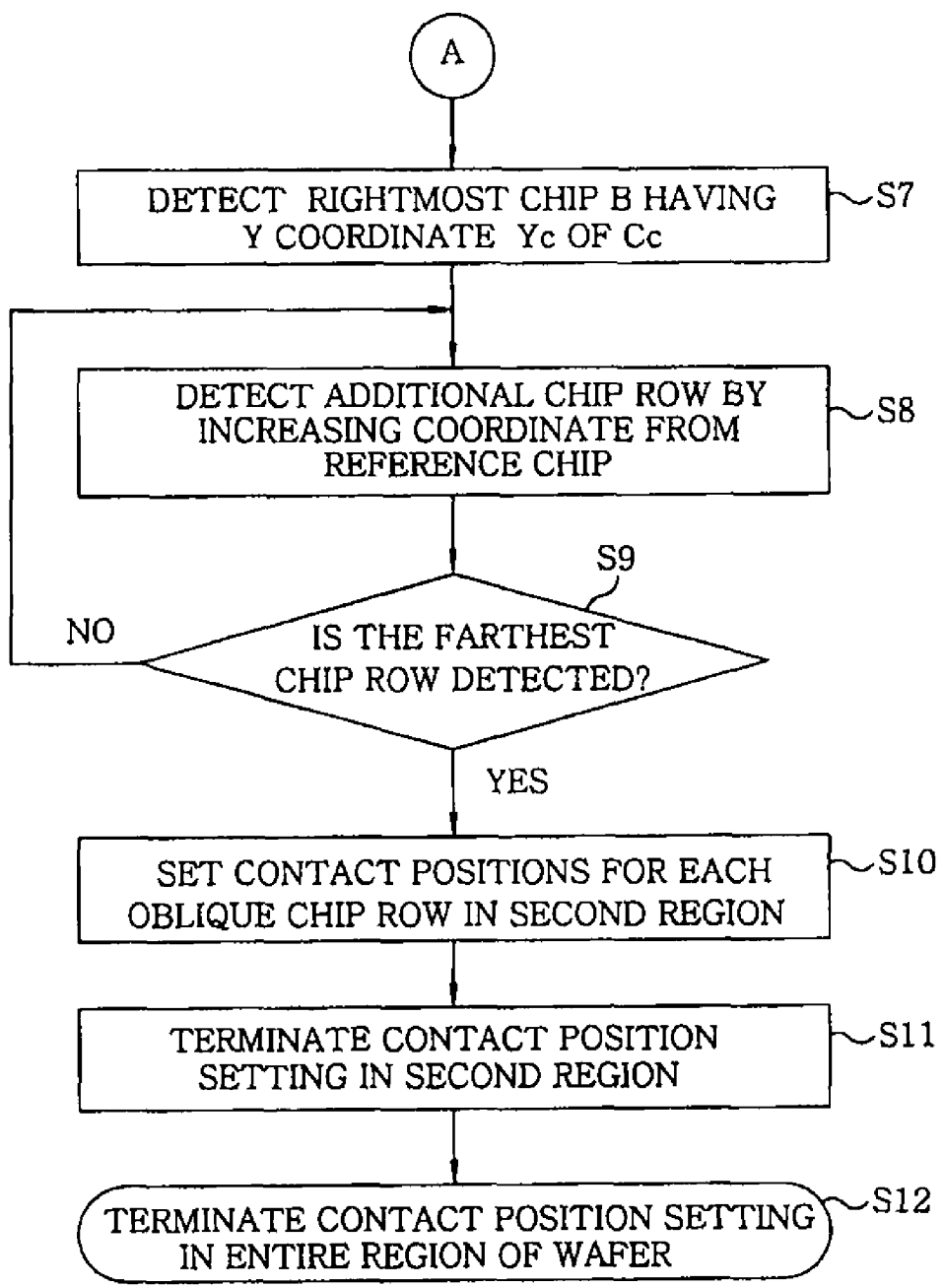
FIG. 3 is a flow chart illustrating subsequent steps of the method of setting probe card contact positions illustrated in FIG. 2.

Next, contact positions are set throughout the second region of the wafer W. As illustrated in FIG. 3, the rightmost chip C having the same y coordinate value as that of the center chip Cc is detected as a chip B (step S7). Contact positions of the multi-card 12 in the second region of the wafer W are detected by using the chip B as a reference point. In the second region, the contact positions are set in a reverse direction to that used in the first region. The coordinate values of the chip B are identified by $(X_{cr}, Y_c)$ and the chip B is set as a reference chip.

More specifically, as shown in FIG. 4B, in order to set the contact positions in the second region, chip B belonging to the rightmost chip column is detected first by increasing the y coordinate value by one from the reference chip and the newly detected chip C is updated as the reference chip; and then the newly set reference chip and chips C residing in the left lower direction from the reference chip are detected as an additional reference oblique or diagonal chip row (step S8). The additional oblique chip row is parallel to the second reference oblique chip row 3. Then, determination is made as to whether the additional oblique chip row thus detected is the one positioned farthest from the second reference oblique chip row 3 (step S9). If not, the flow returns to step S8 and the processing described above is repeated until an additional oblique chip row 4 farthest from the second reference oblique chip row 3 is detected. If the farthest additional oblique chip row 4 is detected in step S9, the process proceeds to step S10 where the contact positions of the multi-card 12 in the second region of the wafer W are set.

In order to set the contact positions throughout the second region of the wafer W in step S10, the uppermost channel CH2 of the probes 12A of the multi-card 12 is aligned with the uppermost chip C of the second reference oblique chip row 3. The positions thus aligned (i.e., positions of the chips aligned with the 4 channels of the multi-card 12) are set as contact positions. In addition, sequentially determined as further contact positions on the second reference oblique chip row 3 as shown in FIG. 4B, are the positions of the channels of the multi-card 12 shifted from the first contact positions by the multiplication number until the lowermost chip C of the second reference oblique chip row 3 is aligned with one of the channels of the multi-card 12. In this manner, the contact positions with respect to each of the oblique chip rows in the second region ranging from the second reference oblique chip row 3 to the additional oblique chip row 4 are set, thus terminating the setting of the contact positions throughout the second region (step S11) and eventually terminating the setting of the contact positions in the entire region of the wafer W (step S12). Since the contact positions in the second region are set by using the uppermost chip C of each oblique chip row in the second region as a reference chip, it is sometimes the case that, in the left lower end contact positions, some of the probes 12A of the multi-card 12 do not make contact with the chips C within the second region but lie outside the wafer W.

Figure 5:
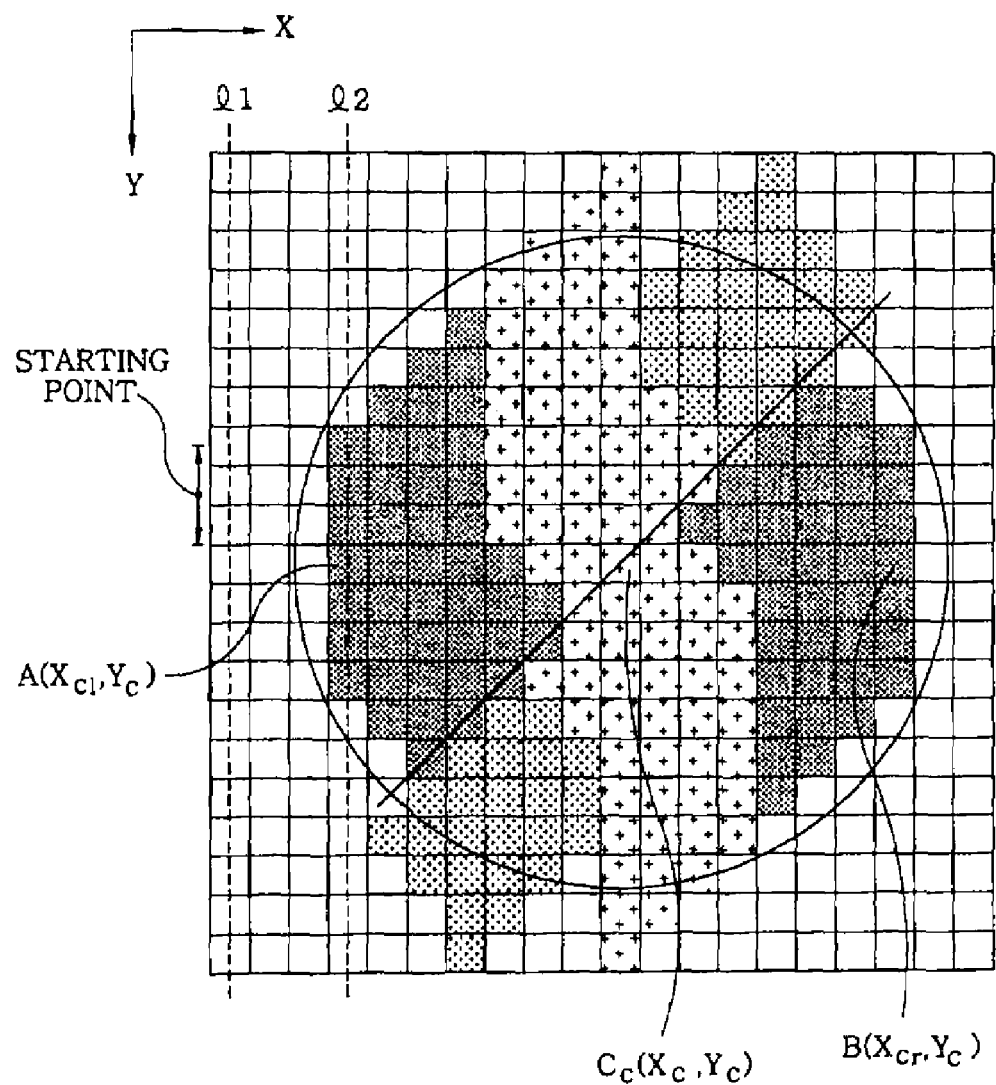
FIG. 5 shows coordinates indicating the arrangement of probe card contact positions set on the wafer in accordance with the flow charts illustrated in FIGS. 2 and 3.
Figure 6:
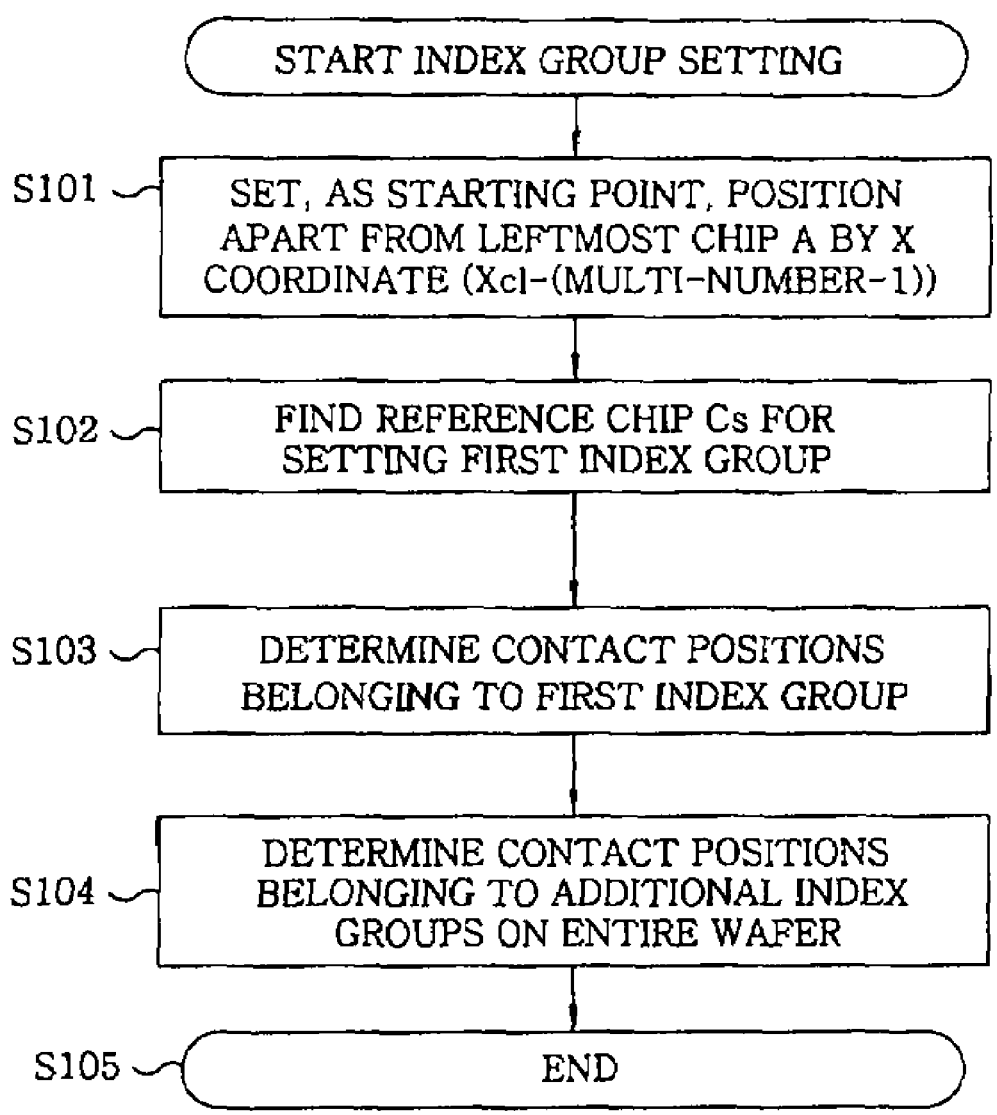
FIG. 6 is a flow chart illustrating a method of setting index groups based on the contact positions set in accordance with the flow charts illustrated in FIGS. 2 and 3.

As shown in FIG. 5, the probes 12A present in the right upper portion of the multi-card 12 may be out of contact with the chips in the first region of the wafer W, and the probes 12A present in the left lower portion of the multi-card 12 may be out of contact with the chips in the second region. For that reason, the non-contact portions of the multi-card 12 are substantially in a point symmetry as shown in FIG. 5, ensuring that the use frequencies of the probes 12A arranged at the opposite end portions of the multi-card 12 are generally evened. This prevents the probes 12A arranged at one end portion of the multi-card 12 from being damaged prematurely, thereby making it possible to prolong the lifespan of the multi-card 12. In FIG. 5, the shades in the dot concentration identify the contact positions set by shifting the probes 12A by the multiplication number of chips in the respective oblique chip rows.

In the manner as set forth above, the contact positions of the multi-card 12 are found in the entire region of the wafer W. Thereafter, the direction of index transfer of the wafer W placed on the mounting table 11 relative to the multi-card 12 is set in accordance with the flow chart illustrated in FIG. 6.

Figure 7:
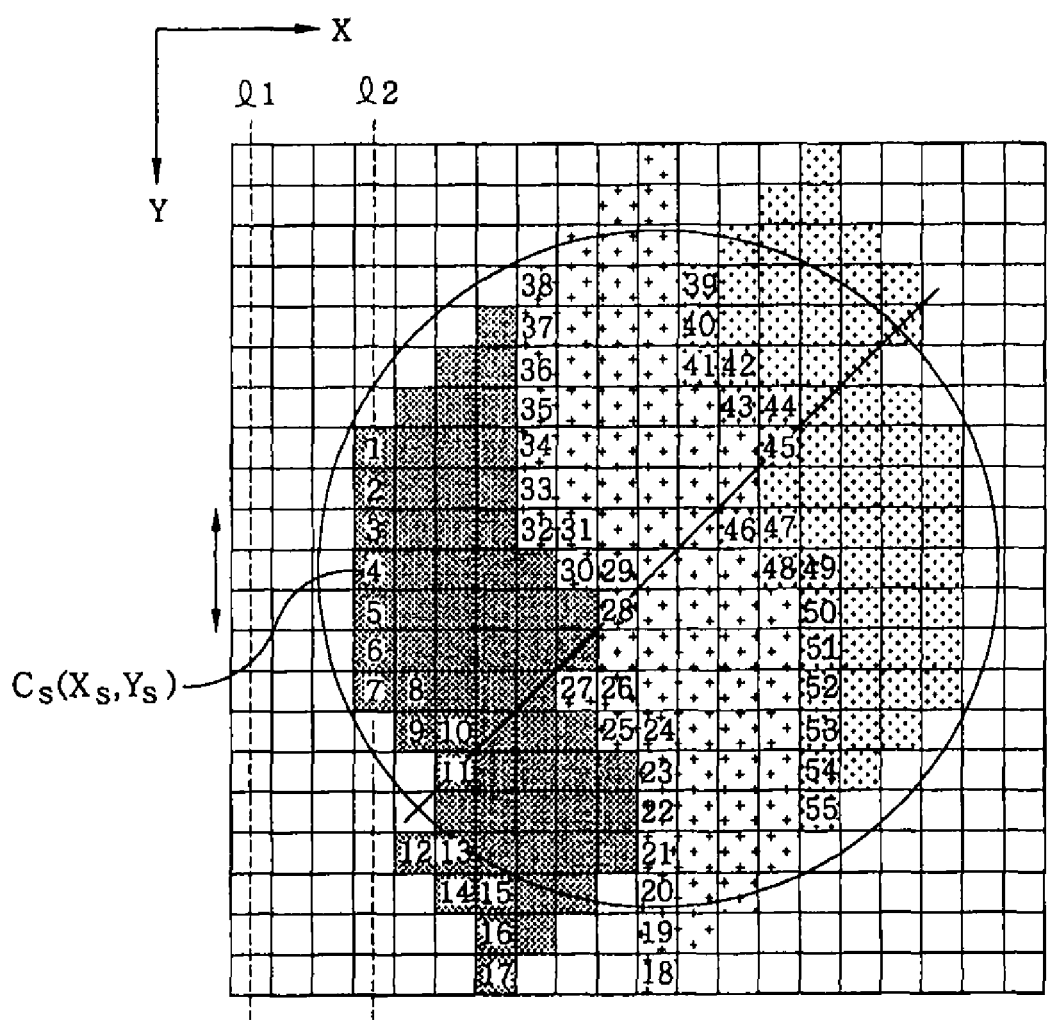
FIG. 7 shows the wafer coordinates indicating an index transfer order of probe card contact positions in the wafer shown in FIG. 5.

As shown in FIG. 7 for example, the index groups are first set by using, as a starting point, a position spaced apart by an x coordinate value, $X_{c1}$−(multi-number−1), from the leftmost chip A of the wafer W (FIG. 5) to the left (step S101). Inasmuch as the multi-number is four in the present embodiment, the x coordinate value at the starting point is equal to $X_{c1}$−(4−1), i.e., $X_{c1}$−3. After determination of the starting point, the contact positions registered in advance are searched as follows until a contact position on the wafer W is first detected (step S102). The starting point exists on the Y-direction broken line l1 shown in FIG. 7. In step S102, a first processing is performed in which the y coordinate value is changed by one in the plus and minus directions (up and down directions) as indicated by an arrow in FIG. 7, while keeping the x coordinate value at $X_{c1}$−3 unchanged, and then it is determined whether a contact position is registered at the position thus changed. If no registered contact position is found in the first processing, a second processing is performed in which one is added to the x coordinate value of the starting point so that the starting point x can be moved to the right, and then it is checked whether a contact position is registered at the position thus changed. If a registered contact position is detected by repeatedly performing the first and the second processing, the contact position thus detected first is used as a reference chip $C_s$ for setting a first index group. In FIG. 7, a registered contact position is detected on a broken line l2.

After the contact position containing the reference chip $C_s$ is detected on the broken line l2, contact positions belonging to the first same index group are determined (step S103). That is, based on the reference chip $C_s$ ($X_s$, $Y_s$) located at the contact position detected in step S102, the setting of the first index group is performed by a first and a second processing of step S103, wherein the reference chip $C_s$ corresponds to a lowermost (or left lower) chip of an oblique chip row. In the first processing of step S103, the registered contact positions are sequentially searched in the minus direction (upward direction) of the Y-axis from the reference chip $C_s$. If the x coordinate value $X_n$ of the left lower contact position of the detected contact positions on an oblique chip row satisfies a condition, the detected contact positions are to be included in the first index group wherein the condition will be defined later.

To be specific, for example, the multi-number of (four, in this embodiment) lowermost sequential contact positions on the oblique chip row passing through the reference chip $C_s$ are detected as the first index group and the x coordinate of the lowermost contact position, i.e., $C_s$, among the detected 4 contact positions is used in checking the condition. Thereafter, a lowermost contact position and on the oblique chip row (or an extension line thereof) shifted by −1 in the y coordinate from the previous oblique chip row passing the reference chip $C_s$ is checked whether it satisfies the condition. If the condition is satisfied the lowermost contact position and its consecutive three contact positions on the same oblique chip row are registered in the first index group. The first processing is performed by shifting the oblique chip row one by one in the negative y-axis direction until the contact positions on the additional oblique chip row 2 (FIG. 4B) are checked.

The condition is given as that the absolute value of the difference between $X_n$ and $X_m$ is smaller than one half of the X-axis multi-number, wherein $X_n$ is the x coordinate of the currently detected lowermost contact position and $X_m$ is the x coordinate of the lowermost contact position just previously enrolled in the index group. By the condition, the amount of movement of the multi-card 12 in x direction can be minimized during the index-transferring process.

If the condition is not satisfied, the detected contact position is included in an index group to be set next time.

If no further contact position exists in the minus direction of the Y-axis during the first processing of step S103, the second processing is performed. In the second processing, the registered contact positions are sequentially searched in the plus direction (downward direction) of the Y-axis from the reference chip $C_s$. If the x coordinate value $X_n$ of the lowermost contact position of the detected contact positions on an oblique chip row satisfies the condition, the detected contact positions are to be included in the first index group. To be specific, the lowermost contact position on the oblique chip row (or an extension line thereof) shifted by +1 in the y coordinate from the oblique chip row passing through the reference chip $C_s$ is checked whether it satisfies the condition, wherein x coordinate value of $C_s$ is set as $X_m$ in this case. If the condition is satisfied, the lowermost contact position and its consecutive three contact positions on the same oblique chip row are registered in the first index group. The second processing is performed by shifting the oblique chip row one by one in the positive y-axis direction until no more lowermost contact position satisfying the condition exists. Then the second processing is terminated to thereby complete the setting of the first index group in the Y-axis direction.

Once the setting of the first Y-direction index group comes to an end, the flow proceeds to step S104 where the setting of the next index group is performed. In step S104, the second index group is set with respect to the contact positions excluding the ones included in the first index group. In other words, the second index group is set by performing the processing of steps S102 and S103 with respect to the remaining contact positions excluding the ones included in the first index group.

In step S104, steps S102 and S103 are repeated until the setting of the index groups is completed with respect to the entire contact positions. If the index groups have been set in the entire region of the wafer W, the setting of index groups is terminated (step S105). In the present embodiment, three index groups are set as shown in FIG. 7. For the purpose of convenience, the three index groups shown in FIG. 7 are identified by the shades in the dot concentration.

After terminating the setting of index groups, index numbers indicating the test order are assigned to the respective contact positions belonging to the first index group in an ascending order from the left upper portion of the wafer W toward the left lower portion thereof. In the second index group, index numbers are assigned to the respective contact positions in an ascending order from the lower portion toward the upper portion of the wafer W. In this way, index numbers of ascending order are assigned to all of the contact positions along a serpentine course extending in up and down directions from the first index group to the final index group as shown in FIG. 7.

Once the index numbers are set as shown in FIG. 7, a test on electrical characteristics of the wafer W is started. The mounting table 11 is first moved in the X and Y directions so that the contact position of index number 1 of the oblique chip row shown in FIG. 7 can be placed just below the multi-card 12. In this state, the wafer W is moved upwards together with the mounting table 11 to bring the electrode pads of four chips C lying in that contact positions into contact with the probes 12A. Subsequently, the wafer W is overdriven to assure electrical contact between the electrode pads of four chips C and the probes 12A, in which state a test on specified electrical characteristics is carried out.

Thereafter, the mounting table 11 is moved downwards and then by a distance of one chip at a time in the lower direction of the Y-axis. In the same manner as applied to the contact positions of index number 1, every four chips C belonging to each of the contact positions of up to index number 17 are simultaneously tested. Thus, the test of the chips C belonging to the first index group comes to an end.

Once the test on the chips C belonging to the first index group is terminated, the wafer W is moved together with the mounting table 11 by a distance of four chips from the contact position of index number 17 to the right along the X-axis direction, consequently reaching the contact positions of index number 18. If the test on the chips C lying in the contact positions of index number 18 comes to an end, the mounting table 11 is displaced by a distance of one chip at a time in the upper direction of the Y-axis from the contact positions of index number 18 to the contact positions of index number 38. Every four chips C belonging to each set of the contact positions of up to index number 38 are simultaneously tested. Thus, the test on the chips C belonging to the second index group comes to an end.

Once the test on the chips C lying in the contact position of index number 38 is terminated, the wafer W is moved together with the mounting table 11 by a distance of four chips C from the contact positions of index number 38 to the right along the X-axis direction, consequently reaching the contact position of index number 39. If the test on the chips C lying in the contact positions of index number 39 comes to an end, the mounting table 11 is displaced by a distance of one chip at a time in the lower direction of the Y-axis from the contact positions of index number 39 to the contact position of index number 55. Every four chips C belonging to each set of the contact positions of up to index number 55 are simultaneously tested. Thus, the test on the chips C belonging to the third index group comes to an end, thereby completing the test on the entire chips C of the wafer W.

In accordance with the embodiment the present invention, the probing method includes a first step of finding a first reference oblique chip row L1 extending in the oblique direction and containing a center chip $C_c$ positioned at the center of the wafer and a plurality of first additional oblique chip rows arranged in parallel with the first reference oblique chip row L1 in a first region at an upper side of the first reference oblique chip row L1 wherein the first reference oblique chip row L1 is a lowermost chip row in the first region and the first reference oblique chip row L1 includes an uppermost chip row of the first region, and setting contact positions between the probes and the first oblique chip rows consisting of the first reference oblique chip row L1 and the first additional oblique chip rows, wherein the contact positions are positions of the probes obtained by shifting the probes by a distance corresponding to the predetermined number of chips at a time using a chip positioned at a lower end of each first oblique chip row as a starting point; a second step of finding a second reference oblique chip row L3 arranged in parallel with and next to the first reference oblique chip row L1 in a second region at a lower side of the first reference oblique chip row L1 and a multiplicity of second additional oblique chip rows arranged in the second region in parallel with the second reference oblique chip row L3, wherein the second reference oblique chip row L3 is an uppermost chip row in the second region and the second additional oblique chip rows includes a lowermost chip row of the second region and setting contact positions between the probes and the second oblique chip rows consisting of the second reference oblique chip row L3 and the second additional oblique chip rows wherein the contact positions are positions of the probes by shifting the probes by a distance corresponding to the predetermined numbers of chips at a time using a chip positioned at an upper end of each second oblique chip row as a starting point; and a third step of, based on the setting of the contact positions made in the first and second steps, setting a first index group containing contact positions disposed at one of a left and a right end portion of the wafer and sequentially setting next index groups for the remaining contact positions, each of the first and the next index groups being elongated in up and down directions, and setting an index transfer order of the respective contact positions along a serpentine course extending in the up and down directions from the first index group toward an index group disposed at the order end portion of the wafer.

Within the same index group, the wafer W is index-transferred by a distance of one chip according to the order of index numbers, thus simultaneously performing the test on electrical characteristics of every four chips. The wafer W is index-transferred by a distance of four chips between the adjoining index groups, consequently performing the tests on electrical characteristics of the entire chips C of the wafer W. As compared to the prior art probing method, this makes it possible to shorten the index transfer distance and the test time, eventually increasing the operational efficiency of a tester. In the first and second regions of the wafer W, the setting of the contact positions is performed in the opposite directions. Thus, the number of probes 12A lying outside the wafer W in the opposite ends of the latter is kept equal, which makes it possible to reduce damage of the probes 12A and to prolong the lifespan of the multi-card 12.

In accordance with the present embodiment, the first step includes detecting a first end chip positioned at one of a left and a right end side of the center chip; detecting a first additional oblique chip row L2 positioned farthest from the first reference oblique chip row L1 in one of an upper and a lower direction of the first end chip; aligning an end chip at said one of the first and the right end side of the first reference oblique chip row L1 with probes 12A at said one of the left and the right end side of the probes 12A, and setting contact positions along the first reference oblique chip row L1 by shifting the distance corresponding to the predetermined numbers of chips without repeatedly aligning the probes 12A with a same chip; and setting contact positions along each of the first additional oblique chip rows in a manner as in the first reference oblique chip row L1.

The second step includes detecting a second end chip positioned at the other end side of the center chip $C_c$; detecting a second additional oblique chip row L4 positioned farthest from the second reference oblique chip row L3 in the other direction of the second end chip; aligning an end chip at the other end side of the second reference oblique chip row L3 with probes 12A at the other end side of the probes 12A and setting contact positions along the second reference oblique chip row L3 by shifting the probes by the distance corresponding to the predetermined number of chips without repeatedly aligning the probes with same chip; and setting contact positions along each of the second additional oblique chip rows in a manner as in the second reference oblique chip row L3. Consequently, it is possible to efficiently set the contact positions in the entire region of the wafer W and to avoid overlappingly testing the same chip C, which assists in increasing the test efficiency.

In accordance with the present embodiment, the third step includes, based on the setting of the contact positions made in the first and second steps, searching contact position at one of a left and a right end of the wafer W; searching contact positions in the up and down directions from the searched contact position and determining whether the absolute value of the difference between the x coordinate of the currently detected lowermost contact position and the x coordinate of the lowermost contact position just previously enrolled in the index group is smaller than one half of the X-axis multi-number; setting the searched contact positions lying within the specified distance as the first index group; and setting the next index groups for the remaining contact positions in a manner as in the first index group. Accordingly, it is possible to efficiently set the index groups within a short period of time.

Second Embodiment

The multi-card 12 with the probes 12A making contact with every four chips arranged in an oblique direction is used in the first embodiment. Unlike the first embodiment, a probe card with probes making contact with every four chips arranged in a transverse direction is used in the second embodiment. In other respects, the second embodiment is similar in construction to the first embodiment. Therefore, the same or equivalent portions in the second embodiment will be designated by the same reference characters as used in the first embodiment. Description will be made by placing emphasis on the characterizing portions.

Figure 8A:
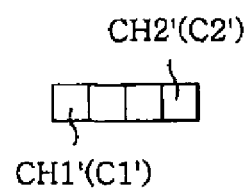

As shown in FIG. 8A for example, the probes 12A of the multi-card 12 are configured to make contact with a chip row including four chips C continuously arranged in a transverse direction, among a plurality of chips C formed in the wafer W in a matrix form, so that the probe card 12 can test every four chips C at a time. In other respects, the probe card 12 of the second embodiment has the same configuration as that of the probe card 12 employed in the first embodiment.

Figure 9:
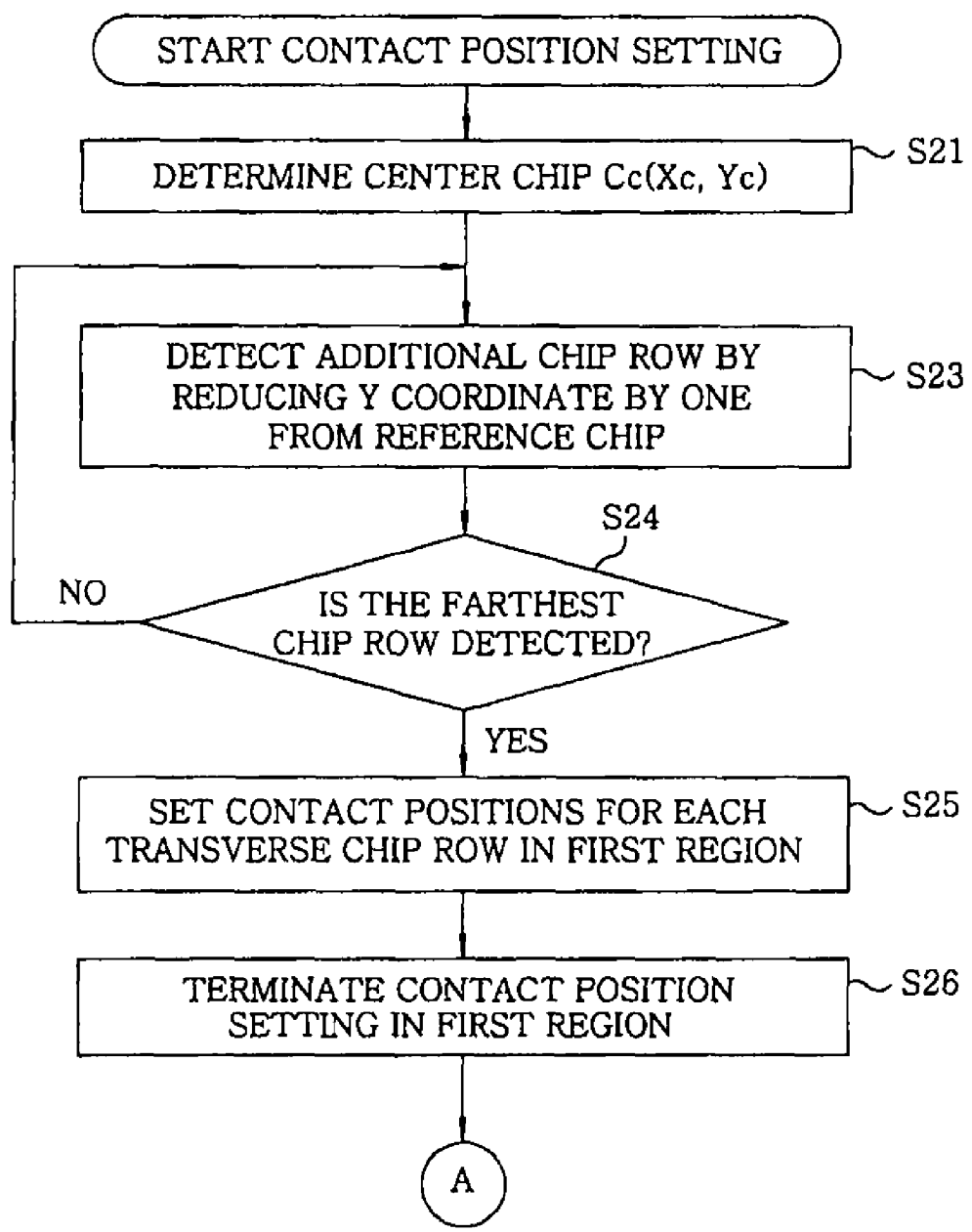
FIG. 9 is a flowchart equivalent to FIG. 2, illustrating a method of setting probe card contact positions in accordance with the second embodiment of the present invention.
Figure 10:
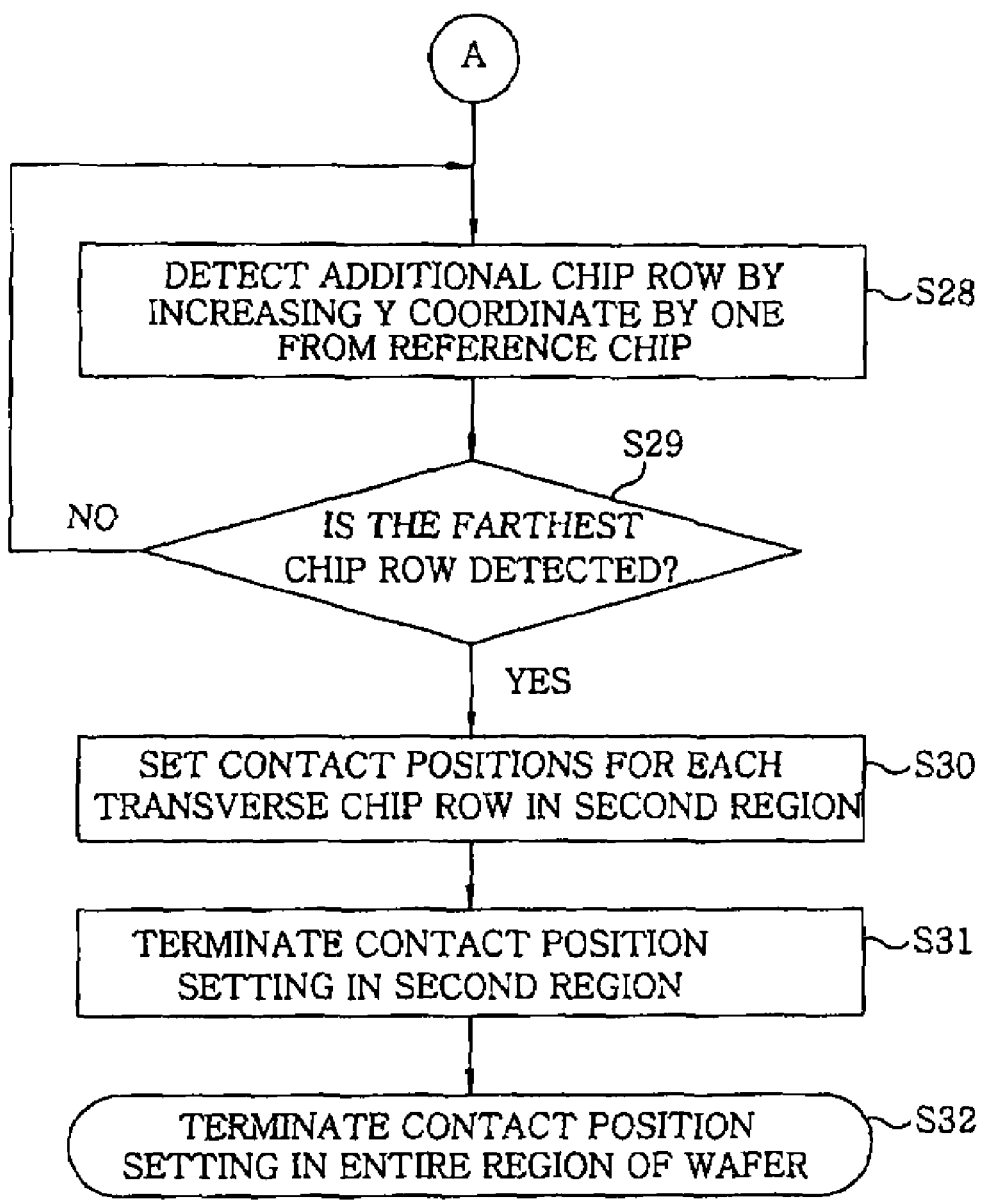
FIG. 10 is a flow chart illustrating subsequent steps of the method of setting probe card contact positions performed subsequent to the flow chart illustrated in FIG. 9.

In the probing method of the present embodiment, the contact positions of the multi-card 12 on the wafer W are first set in accordance with the flow illustrated in FIGS. 9 and 10. Then, the index groups to be used in index-transferring the wafer W and the index order of the contact positions are set based on the contact positions as set above.

Figure 8B:
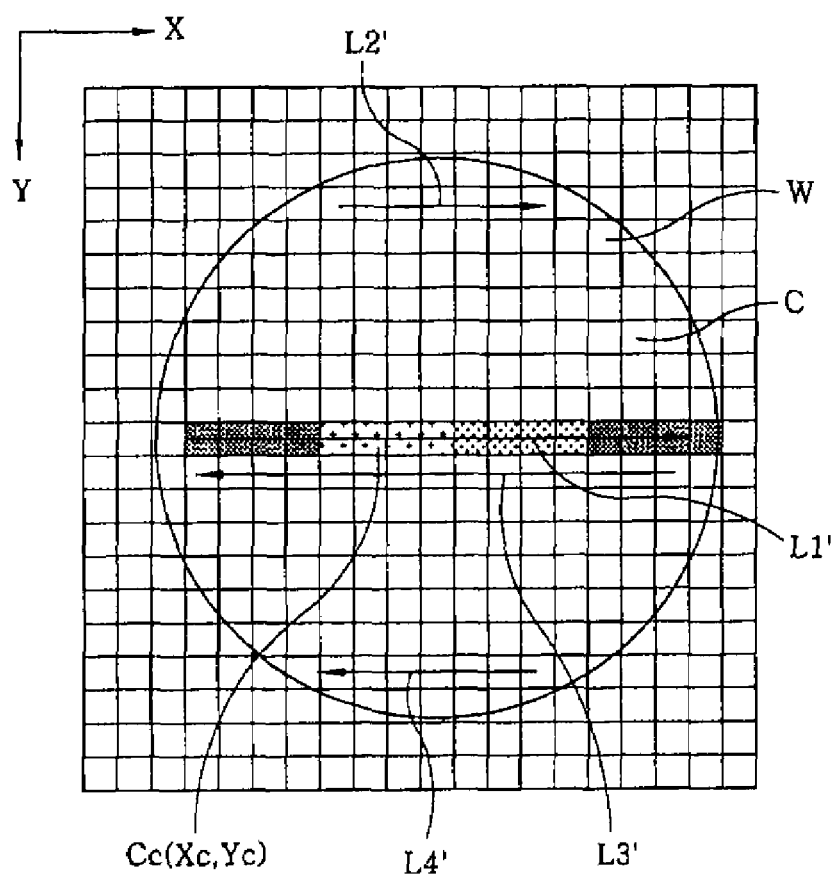

The contact positions in which the probes 12A of the multi-card 12 make contact with the wafer W are set in the following manner. As shown in FIG. 8B, a transverse chip row (hereinafter referred to as a "first reference transverse chip row") L1' containing a center chip $C_c$ of coordinate values ($X_c$, $Y_c$) positioned at the center of the wafer W is set in advance. Using the first reference transverse chip row L1' as a demarcation line, the wafer W is divided into an upper first region containing the first reference transverse chip row L1' and a lower second region not containing the first reference transverse chip row L1' but containing a chip row (hereinafter referred to as a "second reference transverse chip row") L3' positioned at the lower side of and next to the first reference transverse chip row L1'. The contact positions of the multi-card 12 are set in this state.

In accordance with the flow chart illustrated in FIG. 9, the chip C positioned at the center of the wafer W is first determined as the center chip $C_c$ in step S21. Contact positions of the multi-card 12 in the first region of the wafer W are detected by using the chip $C_c$ as a reference point. The chip $C_c$ is set as a reference chip.

In order to set the contact positions in the first region, a chip C is detected first by reducing the y coordinate value by one from the reference chip and the newly detected chip C is updated as the reference chip; and then the newly set reference chip and chips residing in the left and right directions from the reference chip are detected as an additional transverse chip row (step S23). Then, determination is made as to whether the additional transverse chip row thus detected is the one positioned farthest from the first reference transverse chip row L1' (step S24). If not, the flow returns to step S23 and the processing noted above is repeated until an additional transverse chip row L2' farthest from the first reference transverse chip row L1' is detected. If the farthest additional transverse chip row L2' is detected in step S24, the flow proceeds to step S25 where the contact positions of the multi-card 12 in the first region of the wafer W are set.

In order to set the contact positions throughout the first region of the wafer W in step S25, the left end channel CH1' of the probes 12A of the multi-card 12 is aligned with the left end chip C of the first reference transverse chip row L1'. The positions thus aligned (i.e., positions aligned with the 4 channels of the multi-card 12) are set as first contact positions. In addition, sequentially determined as further contact positions on the first reference transverse chip row L1', as shown in FIG. 8B, are the positions of the channels of the multi-card 12 shifted from the first contact positions by the multiplication number at a time until the rightmost chip C of the first reference transverse chip row L1' is aligned with one of the channels of the multi-card 12. In this manner, the contact positions with respect to each of the transverse chip rows in the first region ranging from the first reference transverse chip row L1' to the farthest additional transverse chip row L2' are set, thus terminating the setting of the contact positions throughout the first region (step S26). Since the contact positions in the first region are set by using the leftmost chip C of each chip row in the first region as a reference, it is sometimes the case that, in the right end contact positions, some of the probes 12A of the multi-card 12 do not make contact with the chips C within the first region but lie outside the wafer W.

Next, contact positions are set throughout the second region of the wafer W by using the $C_c$ as a reference point. The chip $C_c$ is set as a reference chip. In the second region, the contact positions are set in a direction opposite to that of the second region.

As shown in FIG. 8B, in order to set the contact positions in the second region, a chip C is detected first by increasing the y coordinate value by one from the reference chip and the newly detected chip C is updated as the reference chip; and then the newly set reference chip and chips residing in the left and right directions from the reference chip are detected as an additional transverse chip row (step S28). Then, determination is made as to whether the additional transverse chip row thus detected is the one positioned farthest from the second reference transverse chip row L3' (step S29). If not, the flow returns to step S28 and the processing noted above is repeated until an additional transverse chip row L4' farthest from the second reference transverse chip row L3' is detected. If the farthest additional transverse chip row L4' is detected in step S29, the flow proceeds to step S30 where the contact positions of the multi-card 12 in the second region of the wafer W are set.

In order to set the contact positions throughout the second region of the wafer W in step S30, the right end channel CH2' of the probes 12A of the multi-card 12 is aligned with the rightmost chip C of the second reference transverse chip row L3'. The positions thus aligned (i.e., positions aligned with the 4 channels of the multi-card 12) is set as first contact positions. In addition, sequentially determined as further contact positions on the second reference transverse chip row L3', as shown in FIG. 8B, are the positions of the channels of the multi-card 12 shifted from the first contact positions by the multiplication number at a time until the leftmost chip C of the second reference transverse chip row L3' is aligned with one of the channels of the multi-card 12. In this manner, the contact positions with respect to each of the transverse chip rows in the second region ranging from the second reference transverse chip row L3' to the farthest additional transverse chip row L4' set, thus terminating the setting of the contact positions throughout the second region (step S31). Since the contact positions in the second region are set by using the rightmost chip C of each chip transverse row in the second region as a reference, it is sometimes the case that, in the left end contact positions, some of the probes 12A of the multi-card 12 do not make contact with the chips C within the second region but lie outside the wafer W.

Figure 11:
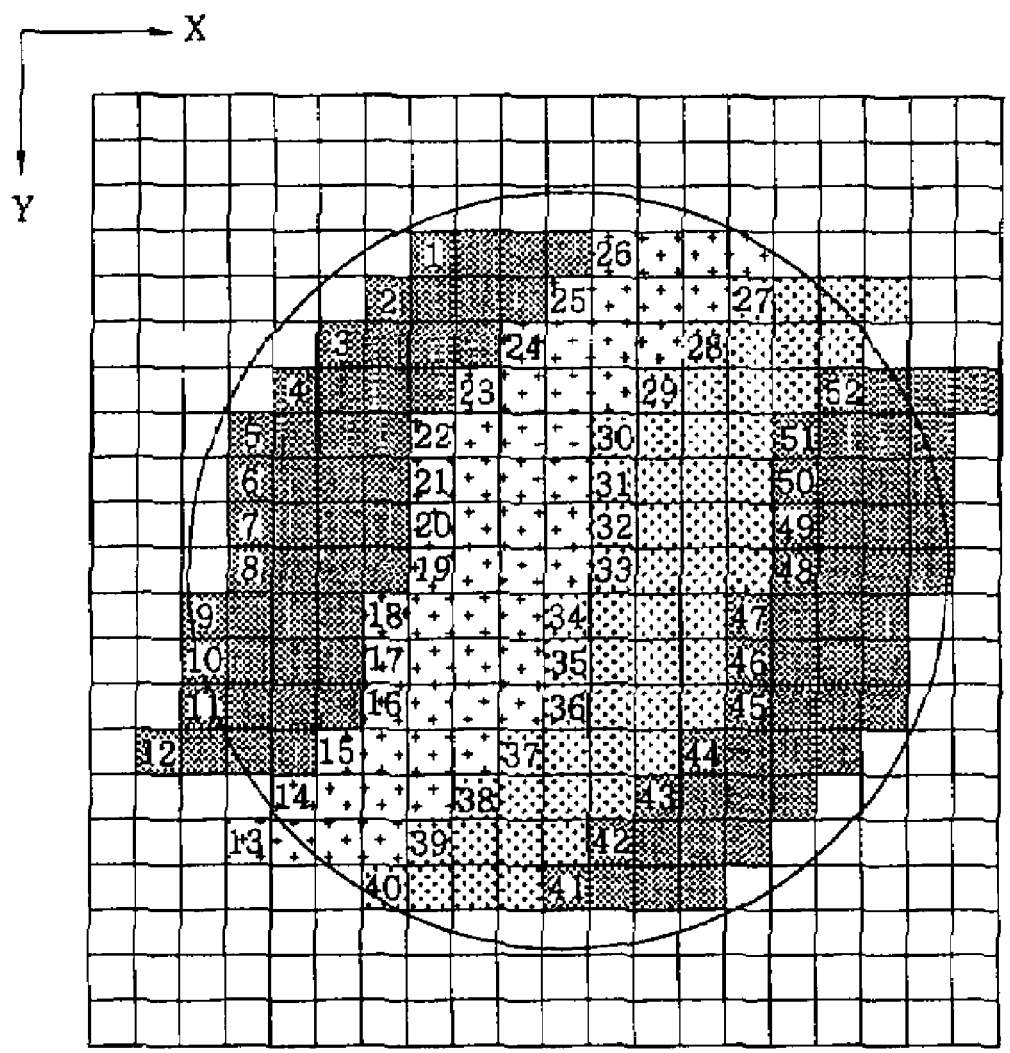
FIG. 11 shows the coordinates indicating the index transfer order of probe card contact positions in the wafer shown in FIGS. 8A and 8B.
Figure 12:
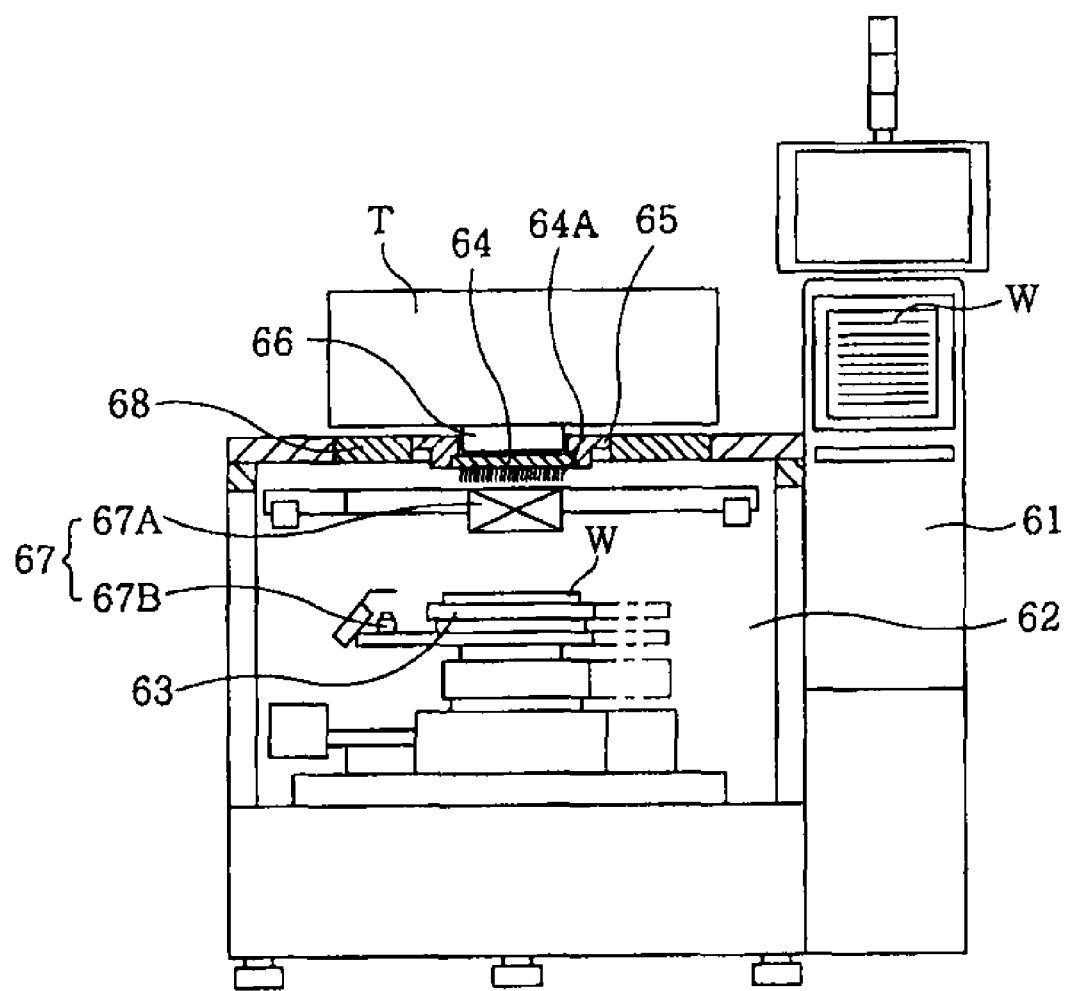
FIG. 12 is a partially cut-away front view showing a conventional probing apparatus.

Referring to FIG. 11, the probes 12A present in the right end portion of the multi-card 12 may be out of contact with the chips in the first region of the wafer W, the probes 12A present in the left end portion of the multi-card 12 are out of contact with the chips in the second region. For that reason, the non-contact portions of the multi-card 12 is substantially in a point symmetry as shown in FIG. 11, ensuring that the use frequencies of the probes 12A arranged at the opposite end portions of the multi-card 12 are generally evened. Consequently, it is possible to prolong the lifespan of the multi-card 12. In FIG. 11, the shades in the dot concentration identify the contact positions set by shifting the probes 12A by the multiplication number of chips in the respective transverse chip rows. The continuously extending area with same shades stands for a same index group.

In the manner as set forth above, the contact positions of the multi-card 12 are found in the entire region of the wafer W. Thereafter, the direction of index transfer of the wafer W placed on the mounting table 11 relative to the multi-card 12 is set in accordance with the flow chart illustrated in FIG. 6. Then, as shown in FIG. 11, index numbers are assigned to the respective contact positions belonging to the a first index group in an ascending order from the left upper portion of the wafer W toward the left lower portion thereof. In a second index group, index numbers are assigned to the respective contact positions in an ascending order from the lower portion toward the upper portion of the wafer W. In this way, index numbers of ascending order are assigned to all of the contact positions along a serpentine course extending in up and down directions from the first index group to the final index group as shown in FIG. 11.

Once the index numbers are set as shown in FIG. 11, a test on electrical characteristics of the wafer W is started. The mounting table 11 is first moved in the X and Y directions so that the contact position of index number 1 of the chip row shown in FIG. 11 can be placed just below the multi-card 12. In this state, the wafer W is moved upwards together with the mounting table 11 to bring the electrode pads of four chips lying in that contact position into contact with the probes 12A. Subsequently, the wafer W is overdriven to assure electrical contact between the electrode pads of four chips C and the probes 12A, in which state a test on specified electrical characteristics is carried out.

Thereafter, the mounting table 11 is moved downwards and then displaced by a distance of one chip at a time in the lower direction of the Y-axis. Like the contact position of index number 1, every four chips C belonging to each of the contact positions of up to index number 12 are simultaneously tested. Thus, the test on the chips C belonging to the first index group comes to an end.

Once the test on the chips C belonging to the first index group is terminated, the wafer W is moved together with the mounting table 11 from the contact positions of index number 12 to the contact positions of index number 13. If the test on the chips C lying in the contact position of index number 13 comes to an end, the table 11 is displaced by a distance of one chip at a time in the upper direction of the Y-axis from the contact position of index number 13 toward the contact position of index number 26. Every four chips C belonging to the contact positions of each index member are simultaneously tested. Thus, the test on the chips C belonging to the second index group comes to an end. Thereafter, the test on the chips C belonging to the remaining index groups is performed in the same manner as set forth above, thereby completing the test on all of the chips C of the wafer W.

In accordance with a second embodiment of the present invention, it is possible to attain the same operational effects as available in the first embodiment.

The present invention is not limited to the embodiments described hereinabove but may be suitably modified or changed if appropriate. For example, the setting of the contact positions and the index groups may be performed in the reverse direction, although the contact positions are set from the left upper portion of the first reference oblique chip row L1 of the wafer W and the index groups are set from the left end toward the right end in the first embodiment. It is equally possible to test the chips of the oblique chip row arranged over a plurality of lines. Although the first reference oblique chip row L1 is inclined in the right upper direction in the first embodiment, an oblique chip row inclined in the left upper direction can also be tested in the same manner as applied to the first embodiment. Although the chip row including four chips arranged along a line is simultaneously tested in the second embodiment, it is also possible to simultaneously test a chip row arranged in a matrix shape over a plurality of rows and columns.

In accordance with the present invention, it is possible to provide a probing method and program capable of reducing the movement distance of a target object such as a wafer or the like to thereby shorten the test time, and also capable of evening use frequencies of probes arranged in the opposite end portions of a probe card to thereby enhance the durability of the probe card.

While the invention has been shown and described with respect to the embodiment, it will be understood by those skilled in the art that various changes and modifications may be made without departing from the scope of the invention as defined in the following claims.

What is claimed is:

1. A probing method for, under the control of a control unit, moving a mounting table with a wafer mounted thereon to bring a plurality of probes of a probe card into electrical contact with a number of chips arranged in the wafer along an oblique direction and for conducting a test of electrical characteristics of the chips, wherein a predetermined number of chips are tested at a time, comprising:

a first step of finding a first reference oblique chip row extending in the oblique direction and containing a center chip positioned at the center of the wafer and a plurality of first additional oblique chip rows arranged in parallel with the first reference oblique chip row in a first region at an upper side of the first reference oblique chip row wherein the first reference oblique chip row is a lowermost chip row in the first region and the first reference oblique chip row includes an uppermost chip row of the first region, and setting contact positions between the probes and the first oblique chip rows consisting of the first reference oblique chip row and the first additional oblique chip rows, wherein the contact positions are positions of the probes obtained by shifting the probes by a distance corresponding to the predetermined number of chips at a time using a chip positioned at a lower end of each first oblique chip row as a starting point;

a second step of finding a second reference oblique chip row arranged in parallel with and next to the first reference oblique chip row in a second region at a lower side of the first reference oblique chip row and a multiplicity of second additional oblique chip rows arranged in the second region in parallel with the second reference oblique chip row, wherein the second reference oblique chip row is an uppermost chip row in the second region and the second additional oblique chip rows includes a lowermost chip row of the second region and setting contact positions between the probes and the second oblique chip rows consisting of the second reference oblique chip row and the second additional oblique chip rows wherein the contact positions are positions of the probes by shifting the probes by a distance corresponding to the predetermined numbers of chips at a time using a chip positioned at an upper end of each second oblique chip row as a starting point; and a third step of, based on the setting of the contact positions made in the first and second steps, setting a first index group containing contact positions disposed at one of a left and a right end portion of the wafer and sequentially setting next index groups for the remaining contact positions, each of the first and the next index groups being elongated in up and down directions, and setting an index transfer order of the respective contact positions along a serpentine course extending in the up and down directions from the first index group toward an index group disposed at the order end portion of the wafer.

2. The probing method of claim 1, wherein the first step comprises:

detecting a first end chip positioned at one of a left and a right end side of the center chip;

detecting a first additional oblique chip row positioned farthest from the first reference oblique chip row in one of an upper and a lower direction of the first end chip;

aligning an end chip at said one of the first and the right end side of the first reference oblique chip row with probes at said one of the left and the right end side of the probes, and setting contact positions along the first reference oblique chip row by shifting the distance corresponding to the predetermined numbers of chips without repeatedly aligning the probes with a same chip; and setting contact positions along each of the first additional oblique chip rows in a manner as in the first reference oblique chip row.

3. The probing method of claim 2, wherein the second step comprises:

detecting a second end chip positioned at the other end side of the center chip;

detecting a second additional oblique chip row positioned farthest from the second reference oblique chip row in the other direction of the second end chip;

aligning an end chip at the other end side of the second reference oblique chip row with probes at the other end side of the probes and setting contact positions along the second reference oblique chip row by shifting the probes by the distance corresponding to the predetermined number of chips without repeatedly aligning the probes with same chip; and setting contact positions along each of the second additional oblique chip rows in a manner as in the second reference oblique chip row.

4. The probing method of claim 1, wherein the third step comprises:

based on the setting of the contact positions made in the first and second steps, searching contact position at one of a left and a right end of the wafer;

searching contact positions in the up and down directions from the searched contact position and determining whether an outer end chip of each of the searched contact positions lies within a specified distance from an outer end chip of the contact position immediately previously searched;

setting the searched contact positions lying within the specified distance as the first index group; and setting the next index groups for the remaining contact positions in a manner as in the first index group.

5. A probing program that operates a computer to perform a probing method for moving a mounting table with a wafer mounted thereon to bring a plurality of probes of a probe card into electrical contact with a number of chips arranged in the wafer along an oblique direction and for conducting a test of electrical characteristics of the chips, wherein a predetermined number of chips are tested at a time, comprising:

a first step of finding a first reference oblique chip row extending in the oblique direction and containing a center chip positioned at the center of the wafer and a plurality of first additional oblique chip rows arranged in parallel with the first reference oblique chip row in a first region at an upper side of the first reference oblique chip row wherein the first oblique chip row is a lowermost chip row in the first region and the first reference oblique chip row includes an uppermost chip row of the first region, and setting contact positions between the probes and the first oblique chip rows consisting of the first reference oblique chip row and the first additional oblique chip rows, wherein the contact positions are positions of the probes obtained by shifting the probes by a distance corresponding to the predetermined number of chips at a time using a chip positioned at a lower end of each first oblique chip row as a starting point;

a second step of finding a second reference oblique chip row arranged in parallel with and next to the first reference oblique chip row in a second region at a lower side of the first reference oblique chip row and a multiplicity of second additional oblique chip rows arranged in the second region in parallel with the second reference oblique chip row, wherein the second reference oblique chip row is an uppermost chip row in the second region and the second additional oblique chip rows includes a lowermost chip row of the second region and setting contact positions between the probes and the second oblique chip rows consisting of the second reference oblique chip row and the second additional oblique chip rows wherein the contact positions are positions of the probes by shifting the probes by a distance corresponding to the predetermined numbers of chips at a time using a chip positioned at an upper end of each second oblique chip row as a starting point; and a third step of, based on the setting of the contact positions made in the first and second steps, setting a first index group containing contact positions disposed at one of a left and a right end portion of the wafer and sequentially setting next index groups for the remaining contact positions, each of the first and the next index groups being elongated in up and down directions, and setting an index transfer order of the respective contact positions along a serpentine course extending in the up and down directions from the first index group toward an index group disposed at the order end portion of the wafer.

6. The probing program of claim 5, wherein the first step comprises:

detecting a first end chip positioned at one of a left and a right end side of the center chip;

detecting a first additional oblique chip row positioned farthest from the first reference oblique chip row in one of an upper and a lower direction of the first end chip;

aligning an end chip at said one of the first and the right end side of the first reference oblique chip row with probes at said one of the left and the right end side of the probes, and setting contact positions along the first reference oblique chip row by shifting the distance corresponding to the predetermined numbers of chips without repeatedly aligning the probes with a same chip; and setting contact positions along each of the first additional oblique chip rows in a manner as in the first reference oblique chip row.

7. The probing program of claim 6, wherein the second step comprises:

detecting a second end chip positioned at the other end side of the center chip;

detecting a second additional oblique chip row positioned farthest from the second reference oblique chip row in the other direction of the second end chip;

aligning an end chip at the other end side of the second reference oblique chip row with probes at the other end side of the probes and setting contact positions along the second reference oblique chip row by shifting the probes by the distance corresponding to the predetermined number of chips without repeatedly aligning the probes with same chip; and setting contact positions along each of the second additional oblique chip rows in a manner as in the second reference oblique chip row.

8. The probing program of claim 5, wherein the third step comprises:

based on the setting of the contact positions made in the first and second steps, searching contact position at one of a left and a right end of the wafer;

searching contact positions in the up and down directions from the searched contact position and determining whether an outer end chip of each of the searched contact positions lies within a specified distance from an outer end chip of the contact position immediately previously searched;

setting the searched contact positions lying within the specified distance as the first index group; and setting the next index groups for the remaining contact positions in a manner as in the first index group.

9. A probing method for, under the control of a control unit, moving a table with a wafer mounted thereon to bring a plurality of probes of a probe card into electrical contact with a plurality of chips arranged in the wafer along a transverse direction and for conducting a test of electrical characteristics of the chips, wherein a determined number of chips are tested at a time, comprising:

a first step of finding a first reference transverse chip row extending in a transverse direction and containing a center chip positioned at the center of the wafer, and setting contact positions between the probes and the first reference chip row, wherein the contact positions are position of the probes obtained by shifting the probes by a distance corresponding to the predetermined number of chips at a time along the first reference chip row, at which time an end chip positioned at one of a left and a right end of the first reference transverse chip row is used as a starting point;

a second step of finding first additional transverse chip rows arranged in parallel with the first reference transverse chip row in a first region at an upper side of the first reference chip row, and setting contact positions between the probes and each first additional transverse chip row wherein the contact positions are position of the probes obtained by shifting the probes by a distance corresponding to the predetermined number of chips at a time along each first additional transverse chip row, at which time an end chip positioned at said one end of each first additional transverse chip row is used as a starting point;

a third step of finding second additional transverse chip rows arranged in parallel with the first reference transverse chip row in a second region at a lower side of the first reference chip row, and setting contact positions between the probes and each second additional transverse chip row wherein the contact positions are position of the probes obtained by shifting the probes by a distance corresponding to the predetermined number of chips at a time along each second additional transverse chip rows, at which time an end chip positioned at the other end of each second additional transverse chip row is used as a starting point; and a fourth step of, based on the setting of the contact positions made in the first through third steps, setting a first index group containing contact positions disposed at one of a left and a right end portion of the wafer and sequentially setting next index groups for the remaining contact positions toward the other end portion of the wafer, each of the first and the next index groups being elongated in up and down directions, and setting an index transfer order of the respective contact positions along a serpentine course extending in the up and down directions from the first index group toward an index group disposed at the other end portion of the wafer.

10. A probing program that operates a computer to perform a probing method for moving a table with a wafer mounted thereon to bring a plurality of probes of a probe card into electrical contact with a plurality of chips arranged in the wafer along a transverse direction and for conducting a test of electrical characteristics of the chips, wherein a determined number of chips are tested at a time, comprising:

a first step of finding a first reference transverse chip row extending in a transverse direction and containing a center chip positioned at the center of the wafer, and setting contact positions between the probes and the first reference chip row, wherein the contact positions are position of the probes obtained by shifting the probes by a distance corresponding to the predetermined number of chips at a time along the first reference chip row, at which time an end chip positioned at one of a left and a right end of the first reference transverse chip row is used as a starting point;

a second step of finding first additional transverse chip rows arranged in parallel with the first reference transverse chip row in a first region at an upper side of the first reference chip row, and setting contact positions between the probes and each first additional transverse chip row wherein the contact positions are position of the probes obtained by shifting the probes by a distance corresponding to the predetermined number of chips at a time along each first additional transverse chip row, at which time an end chip positioned at said one end of each first additional transverse chip row is used as a starting point;

a third step of finding second additional transverse chip rows arranged in parallel with the first reference transverse chip row in a second region at a lower side of the first reference chip row, and setting contact positions between the probes and each second additional transverse chip row wherein the contact positions are position of the probes obtained by shifting the probes by a distance corresponding to the predetermined number of chips at a time along each second additional transverse chip rows, at which time an end chip positioned at the other end of each second additional transverse chip row is used as a starting point; and a fourth step of, based on the setting of the contact positions made in the first through third steps, setting a first index group containing contact positions disposed at one of a left and a right end portion of the wafer and sequentially setting next index groups for the remaining contact positions toward the other end portion of the wafer, each of the first and the next index groups being elongated in up and down directions, and setting an index transfer order of the respective contact positions along a serpentine course extending in the up and down directions from the first index group toward an index group disposed at the other end portion of the wafer.

* * * * *